United States Patent
Choi et al.

(10) Patent No.: US 11,688,833 B2
(45) Date of Patent: Jun. 27, 2023

(54) STRAIN-INDUCING NANOSTRUCTURES FOR SPECTRAL RED-SHIFTING OF LIGHT EMITTING DEVICES

(71) Applicant: VERSITECH LIMITED, Hong Kong (CN)

(72) Inventors: Hoi Wai Choi, Hong Kong (CN); Wai Yuen Fu, Hong Kong (CN)

(73) Assignee: VERSITECH LIMITED, Hong Kong (CN)

(*) Notice: Subject to any disclaimer, the term of this patent is extended or adjusted under 35 U.S.C. 154(b) by 123 days.

(21) Appl. No.: 17/321,744

(22) Filed: May 17, 2021

(65) Prior Publication Data
US 2021/0273140 A1    Sep. 2, 2021

Related U.S. Application Data

(62) Division of application No. 16/493,058, filed on Sep. 11, 2019, now Pat. No. 11,094,855.

(51) Int. Cl.
| | |
|---|---|
| *H01L 27/15* | (2006.01) |
| *H01L 33/50* | (2010.01) |
| *H01L 25/075* | (2006.01) |
| *H01L 33/06* | (2010.01) |
| *H01L 33/12* | (2010.01) |
| *H01L 33/32* | (2010.01) |

(52) U.S. Cl.
CPC ........ *H01L 33/502* (2013.01); *H01L 25/0753* (2013.01); *H01L 33/06* (2013.01); *H01L 33/12* (2013.01); *H01L 33/32* (2013.01)

(58) Field of Classification Search
CPC ......... H01L 33/02; H01L 33/06; H01L 33/12; H01L 33/32; H01L 25/0753
USPC .......................................................... 257/79
See application file for complete search history.

(56) References Cited

U.S. PATENT DOCUMENTS

| | | | |
|---|---|---|---|
| 2005/0280355 A1* | 12/2005 | Lee | ..................... H01L 27/3211 313/506 |
| 2006/0208631 A1* | 9/2006 | Kim | ..................... H01L 51/5265 313/506 |
| 2010/0264400 A1 | 10/2010 | Kim | |

(Continued)

FOREIGN PATENT DOCUMENTS

| | | |
|---|---|---|
| CN | 102347412 A | 2/2012 |
| CN | 103681979 A | 3/2014 |

(Continued)

OTHER PUBLICATIONS

C. Horng-Shyang, Y Dong-Ming, L. Yen-Cheng, C. Cheng-Yen, H. Chi-Feng, T. Tsung-Yi, C. C. Yang, W. Cen-Shawn, and C. Chii-Dong, "Strain relaxation and quantum confinement in InGaN/GaN nanoposts," Nanotechnology, vol. 17, p. 1454, 2006.

(Continued)

*Primary Examiner* — Phuc T Dang
(74) *Attorney, Agent, or Firm* — Leason Ellis LLP

(57) ABSTRACT

A nanostructure fabricated on a semiconductor light-emitting device induces strain in the active region. The active device includes at least one quantum heterostructure, in which the strain changes the extent of Quantum Confined Stark Effect, and thus modifies the wavelength of light emission. By mixing strain relaxation and strain induction effects there is a spectral broadening of the light emission, providing polychromatic light emission.

4 Claims, 5 Drawing Sheets

(56) References Cited

U.S. PATENT DOCUMENTS

| | | |
|---|---|---|
| 2011/0315988 A1 | 12/2011 | Yu |
| 2016/0072007 A1 | 3/2016 | Choi et al. |
| 2016/0093665 A1 | 3/2016 | Schubert |
| 2017/0345802 A1* | 11/2017 | Sung .................. H01L 33/54 |
| 2019/0229149 A1* | 7/2019 | Yoo ..................... H01L 33/30 |

FOREIGN PATENT DOCUMENTS

| | | |
|---|---|---|
| CN | 104396028 A | 3/2015 |
| JP | 2008108924 A | 5/2008 |

OTHER PUBLICATIONS

C. H. Chiu, T. C. Lu, H. W. Huang, C. F. Lai, C. C. Kao, J. T. Chu, C. C. Yu, H. C. Kuo, S. C. Wang, C. F. Lin, and T. H. Hsueh, Fabrication of InGaN/GaN nanorod light-emitting diodes with self-assembled Ni metal islands, *Nanotechnolopy*, vol. 18, p. 445201, 2007.

Q. Wang, J. Bal, Y. P. Gong, and T. Wang, "Influence of strain relaxation on the optical properties of InGaN/GaN multiple quantum well nanorods," *Journal of Physics D—Applied Physics*, vol. 44, p. 395102, Oct. 5, 2011.

Q. Li, K. R. Westlake, M. H. Crawford, S. R. Lee, D. D. Koleske, J. J. Figiel, K. C. Cross, S. Fathololoumi, Z. Mi, and G. T. Wang, "Optical performance of top-down fabricated InGaN/GaN nanorod light emitting diode arrays," *Optics Express*, vol. 19, pp. 25528-25534, Dec. 5, 2011.

J. Bai, Q. Wang, and T. Wang, "Characterization ofInGaN-based nanorod light emitting diodes with different indium compositions," *Journal of Applied Physics*, vol. 111, p. 113103, Jun. 1, 2012.

G. Yang, Y. Guo, H. Zhu, D. Yan, G. Li, S. Gao, and K. Dong, "Fabrication ofnanorod InGaN/GaN multiple quantum wells with seif-assembled Ni nano-island masks," *Applied Surface Science*, vol. 285, Part B, pp. 772-777, Nov. 15, 2013.

Y. D. Zhuang, C. J. Lewins, S. Lis, P. A. Shields, and D. W. E. Allsopp, "Fabrication and Characterization of Light-Emitting Diodes Comprising Highly Ordered Arrays ofEmissive InGaN/GaN Nanorods," *IEEE Photonics Technology Letters*, vol. 25, pp. 1047-1049, 2013.

*Phosphors, Up Conversion Nano Particles, Quantum Dots and Their Applications* vol. 1: Springer-Verlag Berlin Heidelberg, 2017.

W. Davis and Y. Ohno, "Color quality scale," *Optical Engineering*, vol. 49, pp. 033602-033602-16, 2010.

L. Williamson. (2016). *LED Lighting Industry Poised for Growth Explosion Beyond 2016*. Available: http://www.ledinside.com/outlook/ 2016/6/led lighting industry poised for growth explosion beyond 2016.

International Search Report and Written Opinion in corresponding PCT Application No. PCT/CN2018/078679, dated Jun. 11, 2018.

Non-Final Office Action in corresponding U.S. Appl. No. 16/493,058, dated Dec. 1, 2020.

* cited by examiner

STRAIN-INDUCING NANOSTRUCTURES FOR SPECTRAL RED-SHIFTING OF LIGHT EMITTING DEVICES

CROSS-REFERENCE TO RELATED PATENT APPLICATIONS

This application is a Divisional of U.S. application Ser. No. 16/493,058, filed Sep. 11, 2019; now patent Ser. No. 11/094,855, which is a U.S. National Phase Application under 35 U.S.C. § 371 of International Patent Application No. PCT/CN2018/078679, filed Mar. 12, 2018, and claims the benefit of priority under 35 U.S.C. Section 119(e) of U.S. Application Ser. No. 62/470,698, filed Mar. 13, 2017, which are incorporated herein by reference in their entireties. The International Application was published in English on Sep. 20, 2018 as International Publication No. WO/2018/166414 A1.

FIELD OF THE INVENTION

The present invention relates to nanostructures fabricated on semiconductor devices and, more particularly, to nanostructure that include at least one quantum heterostructure for light emission.

BACKGROUND OF THE INVENTION

Nitride-based light-emitting diodes (LEDs) have becoming a key player in the global lighting market. With higher energy efficiency and a longer lifetime, LEDs have gradually replaced conventional incandescent bulbs and compact fluorescent lamps (CFLs) as light sources for general lighting, as well as backlighting for displays. White light LEDs, which are most commonly used now, are based on a blue LED that is coated with phosphor to convert some of the blue light into yellow light. White light can thus be produced by mixing the blue light and yellow light. However, this color conversion process causes a loss of efficiency due to Stokes shift, in addition to a lower lifetime and lower reliability caused by the use of the phosphor material.

To avoid efficiency loss for white light LEDs, an alternative way would be to mix separate LEDs that emit different colors into a single package without external color conversion. Nevertheless, current green LEDs based on an Indium alloy are less mature than blue and red LEDs. In particular, internal quantum efficiency (IQE) of the green LEDs drops drastically as the Indium content is increased to tune the emission wavelength from blue light into green light. This absence of efficient LEDs in the green spectral region is known as the "green gap." It is one of the key challenges for the current development of LEDs.

Nanostructuring is one way to adjust the color of light emitted from grown LEDs. Strain in a quantum well originates from a mismatch of growth temperature and the crystal structure of the material. By fabricating nanostructures that allow strain relaxation, the Quantum Confined Stark Effect (QCSE) in the active region of the LED, the multi-quantum wells (MQWs), can be reduced, thus shifting the emission wavelength to a shorter wavelength, i.e., blue-shift. This idea was suggested in a previous patent, i.e., U.S. Pat. No. 9,401,453 B2. According to this patent, by varying the diameters of nanostructures on an LED ranging from 150 nm to 7 μm in diameter, different color can be obtained and a white light LED can be achieved. The emission wavelengths are blue shifted (emission of longer wavelength is shortened) as a result of having experienced strain relaxation. However, since only blue-shift is allowed, to make use of these nanostructures for tuning the color of light emission, the nanostructures have to be fabricated on a long wavelength Indium-alloy based LED, i.e., a green LED, and therefore this process does little to improve the efficiency of the green LEDs.

SUMMARY OF THE INVENTION

Embodiments of the subject invention provide the design of a nanostructure that, when fabricated close to a light-emitting active region comprising at least one quantum heterostructure in a strained structure, can be utilized for modification of the wavelength of light emission from semiconductor light emitters by inducing strain in this active region. The process of manufacturing such LEDs is also provided. This kind of nanostructure is capable of spectrally shifting the light emission to a longer wavelength, and/or broadening the emission spectrum of the light when the active region comprises more than one quantum heterostructure.

The nanostructures are fabricated via a top-down technique. By fabricating a nanostructure that is etched down close to but not completely through the multiple quantum well (MQW) layer, the blue-shift effect caused by the strain relaxation mechanism can be suppressed and a spectral red-shift is caused by the residual strain.

In an embodiment, a semiconductor light-emitting diode can include a light-emitting active region. The light-emitting region is located at the base of the nanostructures for spectral red-shift.

In another embodiment, a semiconductor light-emitting diode can include a light-emitting active region. The active region is partially inside the nanostructure after fabrication. The active region inside the nanostructure causes spectral blue-shift due to strain relaxation, while the other part underneath the nanostructure causes spectral red-shift due to strain induction. Thus the emission spectrum is broadened.

In an embodiment, nano-sphere lithography can be used to create a nano-pattern for fabrication of strain-induced nanostructures as described herein. A nano-sphere coating, which can serve as a lithographic mask for pattern transfer to form nano-pillars, can be prepared by mixing various nano-sphere colloidal solutions and subsequently coating the solution onto the wafer surface.

BRIEF DESCRIPTION OF THE DRAWINGS

The foregoing and other objects and advantages of the present invention will become more apparent when considered in connection with the following detailed description and appended drawings in which like designations denote like elements in the various views, and wherein:

FIGS. 1A and 1B illustrate perspective and cross-sectional views of a strain-inducing nanostructure fabricated on a wafer comprising a light-emitting active region for spectral red-shift, wherein FIG. 1A shows the nanostructure fabricated on the p-contact layer, and FIG. 1B shows the nanostructure fabricated on the n-contact layer and the un-doped layer;

FIGS. 2A and 2B illustrate an ensemble of the strain-inducing nanostructures fabricated on a wafer comprising a light-emitting active region, wherein FIG. 2A shows a variety of nanostructures that result in a spectral red-shift and broadening, and FIG. 2B shows a plurality of uniform nanostructures that result in a uniform spectral red-shift;

FIG. 5 illustrates the transfer of a nanoscale pattern to a wafer comprising a light-emitting active region for fabrication of strain-inducing nanostructures, where

DETAILED DESCRIPTION OF THE INVENTION

Figure 1A:
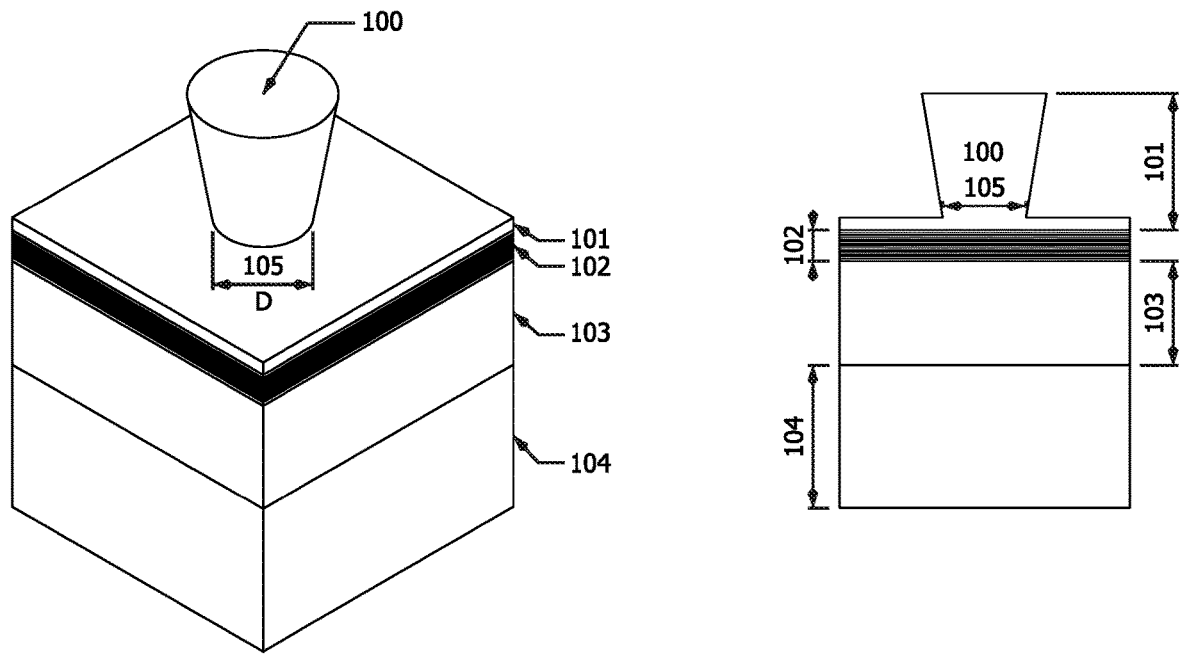

A semiconductor heterostructure is a sandwich of or junction between two dissimilar semiconductors with different band gaps. A quantum heterostructure is a heterostructure in a substrate (usually a semiconductor material), where size restricts the movement of the charge carriers, forcing them into a quantum confinement. This leads to the formation of a set of discrete energy levels at which the carriers can exist. Quantum heterostructures have a sharper density of states than structures of more conventional sizes. Examples of quantum heterostructures confining the carriers in quasi-two, -one and -zero dimensions are: quantum wells, quantum wires and quantum dots.

Embodiments of the subject invention provide a design for a nanostructure which, when fabricated close to a light-emitting active region comprising at least one quantum heterostructure in a strained structure, can be utilized for modification of the wavelength of light emission from semiconductor light emitters by inducing strain in this active region. The process for manufacturing the structure is also provided. Such kinds of nanostructure are capable of spectrally shifting the light emission to a longer wavelength, and/or broadening the emission spectrum of the light when the active region comprises more than one quantum heterostructure.

Most of the nanostructures suitable for the present invention are fabricated using a top-down technique. Top down fabrication can be likened to sculpting from a block of stone. A piece of base material is gradually eroded until the desired shape is achieved. That is, the process starts at the top of the blank piece and works its way down removing material from where it is not required. Nanotechnology techniques for top down fabrication vary but can be split into direct-write (maskless) lithography and lithography with a mask. For a maskless process, the nanoscale pattern is being directly written to the base material using an electron beam, a focused ion beam, a laser beam or a nanoscale tip. As for the process with a mask, the required material is protected by a mask and the exposed material is etched away. Depending upon the level of resolution required for features in the final product, the definition of a nanoscale mask pattern can be created using ultraviolet light, x-rays or electron beams on photomasks or by directly using a nanoparticle coating as the mask. Etching of the base material can then be done chemically using acids or various dry etching techniques, including but not limited to reactive-ion etching (RIE) and inductively-coupled plasma (ICP) etching.

When the nanostructure is fabricated on a compressively-strained layer, strain relaxation will occur as the increased surface area allows a greater degree of atomic displacements. When the atoms move towards the surface to relax the strain, atoms near and beneath the base of the nanostructure will be pulled towards the nanostructure as a result. This "pulling" force thus induces strain in the region near the base of the nanostructure. For example, the strain induction mechanism originates from the pulling force formed around the base of the nanostructure due to the strong ionic-covalent bond in nitrides, as the nanostructure itself expands outward during the relaxation. When the base of the nanostructure is placed near a quantum heterostructure, the increase in strain leads to an increase in the Quantum Confined Stark Effect (QCSE), changing the bandgap of the quantum heterostructure. This mechanism induces the red-shift effect. Therefore, the extent of change in the wavelength of light emitted depends on the increase in strain in the active region.

Theoretically, at 18% indium content (corresponding to about 500 nm emission wavelength), an InGaN/GaN quantum well can exhibit a spectral red-shift up to 30 nm, assuming a low 1 GPa residual stress in the LED structure. The extent of spectral shift will be even larger as the Indium content, the residual stress or the aspect ratio of the nanostructures increases.

It was discovered by the inventors that the induced strain can be increased by reducing the base area of the nanostructure, and/or by increasing the total strain relaxed by the nanostructure, which depends on the strain of the structure before fabrication and the volume or surface area of the nanostructure.

It will be understood that when the nanostructure is referred to as being "on" the active region comprising at least one quantum heterostructure, it means that the region of strain induction caused by the nanostructure overlaps with the active region, regardless of whether the nanostructure is above, below or partly in the active region, or a combination of these positions when there are a plurality of nanostructures.

In an embodiment, nano-sphere lithography (NSL) can be employed for nano-patterning. The use of nano-spheres has many distinct advantages, including but not limited to: (1) it is a low-cost self-assembly approach towards nanofabrication; (2) it is a parallel method of patterning, creating large areas at a time; (3) it is capable of producing close-packed nano-features; (4) it allows dimension control with the use of differently-sized nano-spheres; and (5) additional non-close-packed patterns can be achieved by modifying the nano-sphere pattern (by etching or otherwise) prior to pattern transfer.

In alternative embodiments, other nano-patterning techniques can be used, including but not limited to electron-beam lithography or nanoimprint lithography, although the throughput, flexibility, and cost may not be as competitive as with NSL. Nano-patterning techniques that form irregular shapes can also be used, including but not limited to annealing of thin metal film.

In one embodiment nanopillars were used. Nano-sphere lithography was employed to coat a monolayer of silica nano-sphere with a diameter of 100 nm on InGaN/GaN based LED samples. The nano-spheres then acted as a mask for the subsequent inductively coupled plasma (ICP) etching. The resulting nanopillars had a height smaller than the thickness of the p-GaN layer. This avoided allowing the strain in the quantum wells (QWs) to relax and instead induced strain in the QWs via the relaxation of the nanopillars.

When strain is induced in the active region, the increased QCSE will increase the band bending effect, thus decreasing the bandgap of the quantum heterostructure. But this also causes a larger spatial separation between electron and hole wave functions, leading to lower internal quantum efficiency (IQE) of light-emitters. An alternative way to decrease bandgap is by changing the alloy composition in quantum heterostructures directly during growth of the structure. However, for some kinds of alloys, including but not limited to InGaN and InAlN, changing of the alloy composition to decrease the bandgap energy leads to an increase in lattice mismatch strain, phase separation and compositional pulling, which lead to an increase in defect density. This can cause further loss in IQE, in addition to that from a change in QCSE. Another added benefit of nanostructures on light-emitters is that the vastly increased surface roughness will greatly enhance light extraction, so the overall device efficiency can potentially increase.

FIG. 1 illustrates embodiments of the strain-inducing nanostructure 100 fabricated on a semiconductor light-emitting device, comprising of an active region 102 with at least one quantum heterostructure. A typical semiconductor light-emitting device comprises of a III-V binary, ternary or quaternary alloy based quantum wells (QWs) active region, a p-type III-V semiconductor contact layer, an n-type III-V semiconductor contact layer, and an un-doped semiconductor grown on a suitable substrate (e.g., sapphire, SiC, or Si). Referring to FIG. 1A, the nanostructure fabricated should be placed near to the active region 102, such that the layer above, 101, should be thin or non-existent, so that the region with strain induction overlaps with the active region 102. The whole structure, 101-104, should be compressively strained, including by, but not limited to strain induced by thermal mismatch of grown layers, and lattice mismatch between grown layers.

In an embodiment shown by FIG. 1A, the nanostructure 100 is fabricated on the p-type III-V semiconductor layer 101 of an LED wafer. The resulting p-type layer after fabrication comprises not only the nanostructure 100, but also a thin un-etched layer 101 between the nanostructure 100 and the active region 102 with a thickness of less than 50 nm. Thus, the active region 102 is intact after fabrication. Underneath the nanostructure 100 and the un-etched p-type layer 101 there are also a III-V binary, ternary or quaternary alloy based quantum wells (QWs) active region 102, an n-type III-V semiconductor layer 103, and an un-doped III-V semiconductor grown on a suitable substrate (e.g., sapphire, SiC, or Si) 104.

Figure 1B:
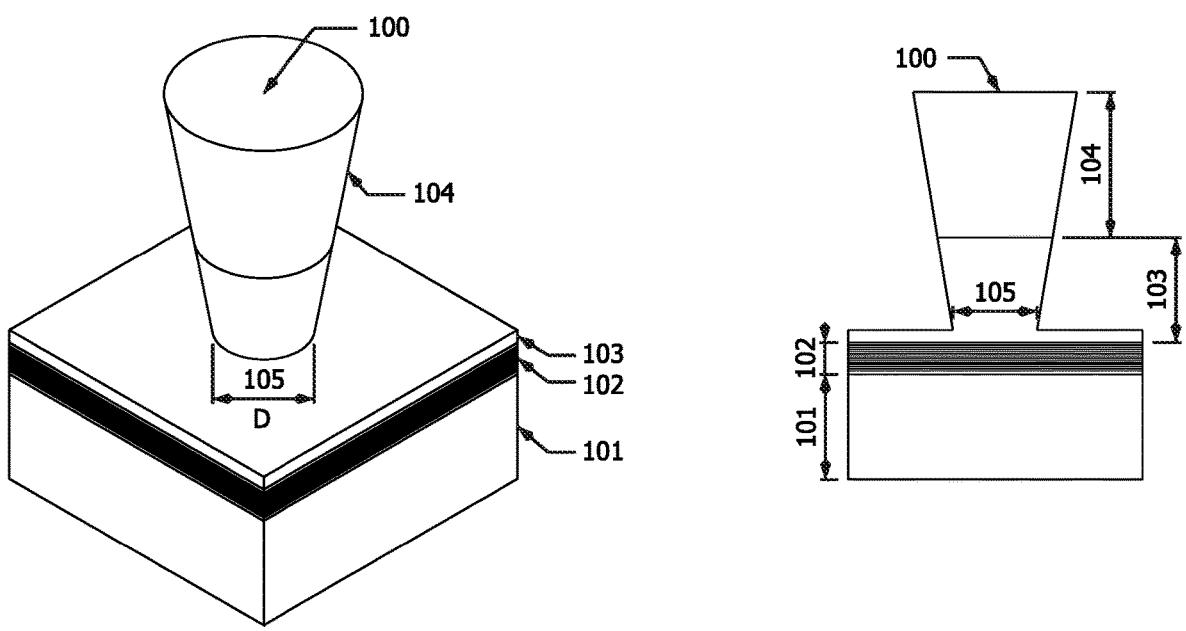

In another embodiment shown in FIG. 1B, the nanostructure 100 is fabricated with both the un-doped III-V semiconductor layer 104 and the n-type III-V semiconductor layer 103 of an LED wafer. The substrate of the LED wafer is removed via a laser lift-off process or a chemical-mechanical polishing process, so that the pattern transfer process can be undertaken on the backside, i.e., with the un-doped layer on the top. The etching goes through both the layers 104 and 103 until the base of the nanostructure 100 is close to the active region 102. As such there is a thin n-type layer 103, with a thickness of less than 50 nm, which is left un-etched right below the nanostructure 100. Underneath the nanostructure 100 and the remaining n-type layer 103 there are also a III-V binary, ternary or quaternary alloy based quantum heterostructure 102 and a p-type III-V semiconductor contact layer 101. The effect of strain induction is thus increased with a larger aspect ratio when comparing to FIG. 1A, since the nanostructure is fabricated through the n-contact layer and the un-doped layer. It is more beneficial to fabricate the nanostructure this way instead of increasing the p-contact layer thickness by growth as in FIG. 1A since the light extraction efficiency can deteriorate with a thicker p-contact layer.

The nanostructures have a base 105 with a diameter dimension D. The base 105 of the nanostructure is sufficiently small so that a high enough strain can be induced to affect the QCSE. The total strain induced near the base 105 depends on the total strain relaxed by the nanostructure 100, so the volume or surface area of the nanostructure should be large. This means that to maximize the effect of strain induction, and thus the change in QCSE, the area of the base 105 should be minimized while maximizing the volume or surface area of the nanostructure 100.

Figure 2A:
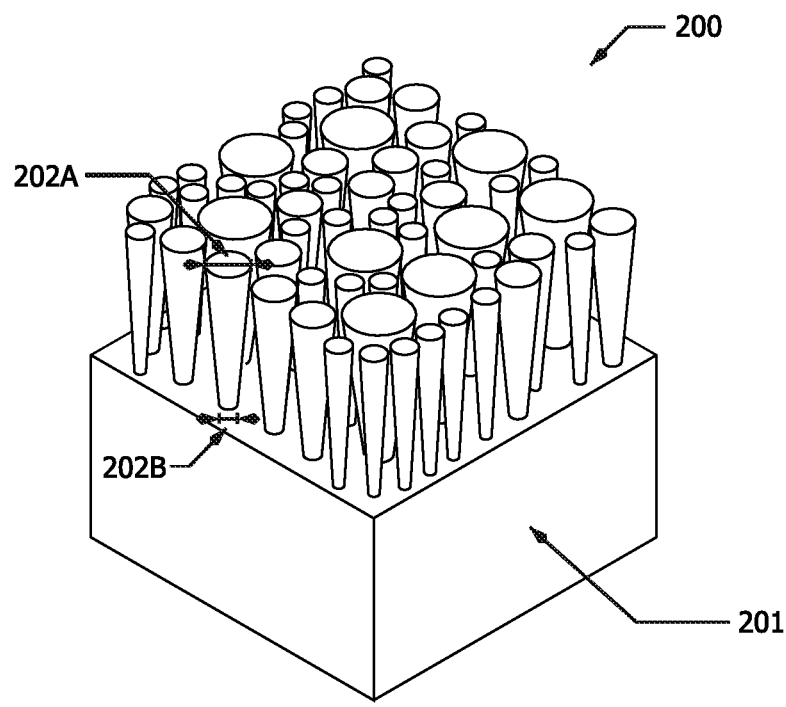
Figure 2B:
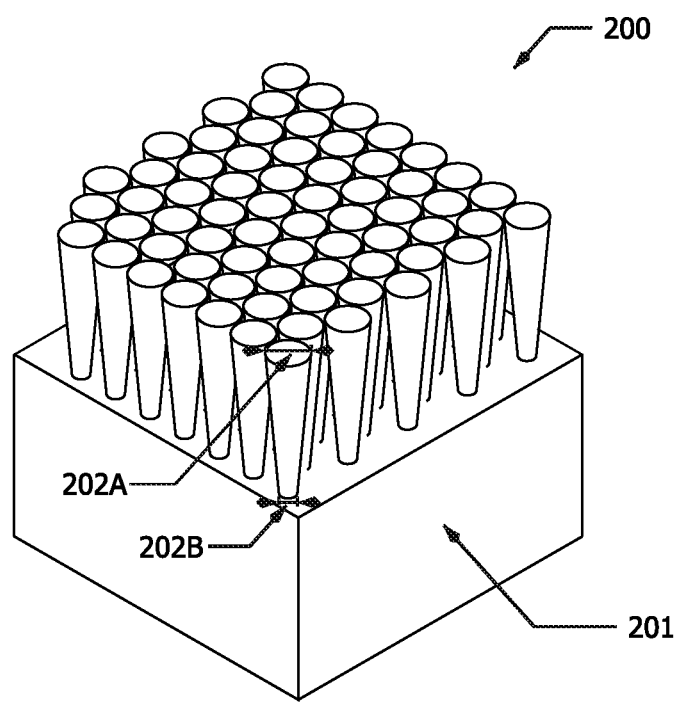

FIG. 2 shows a wafer of light-emitting devices with an ensemble of the strain-inducing nanostructures for spectral red-shift. The ensemble of nanostructures 200 is fabricated on top of a light-emitting structure 201, which comprises an active region near the nanostructures after the fabrication. In this embodiment, the nanostructures have been optimized such that the base 202B is kept small while the size 202A of the nanostructure is maximized in order to maximize the strain induced. The reverse-tapered structure can be fabricated by ICP etching under high pressure. FIG. 2A shows a variety of nanostructures that result in spectral red-shift and broadening, and FIG. 2B shows a plurality of uniform nanostructures that result in a uniform spectral red-shift.

In one embodiment, the gap between the nanostructures formed due to etching can be filled for surface planarization. The methods for filling the gaps include but are not limited to coating of spin-on-glass and re-growth of semiconductor material. An optically semi-transparent current-spreading layer such as indium-tin-oxide (ITO) or Ni/Au can electrically interconnect the pillars for electroluminescent operation.

Figure 3:
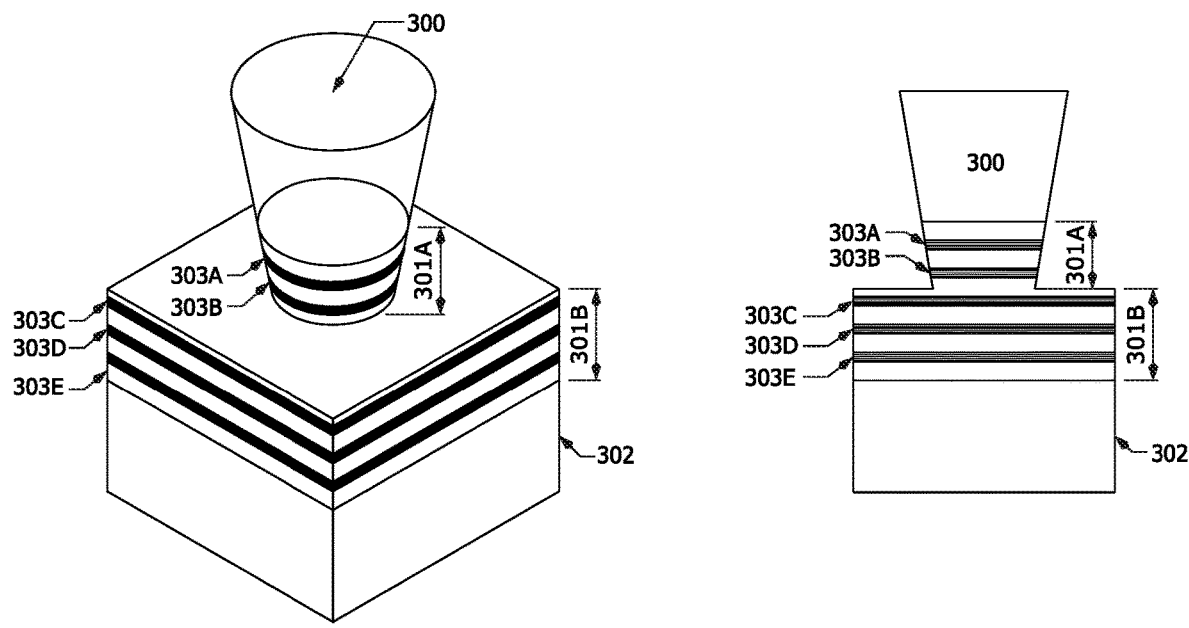
FIG. 3 illustrates a strain-inducing nanostructure fabricated on a wafer comprising a light-emitting active region for spectral broadening.

FIG. 3 illustrates an alternative embodiment of the nanostructure for spectral broadening. The nanostructure 300 is fabricated such that the active region is partially within the nanostructure, as indicated by 301A. However, the other parts of the active region, 301B, are untouched by the fabrication as with the rest of the light-emitting device structure, 302. Both parts of the active region, 301A and 301B, comprise at least one quantum heterostructure. Strain in 301A will relax while that in 301B will increase due to strain induction. As the quantum heterostructures, 303A-E, are at different positions in the active region (301A, 301B) relative to the base of the nanostructure, the spectral shift behavior will be different for these quantum heterostructures. The quantum heterostructures 303A and 303B are in the active region contained in the nanostructure such that the sidewall is exposed for strain relaxation, thus 303A and 303B will exhibit spectral blue-shift. The extent of strain induction is strongest at the base of the nanostructure. Therefore, quantum heterostructure 303C will exhibit the most spectral red-shift, with the spectral red-shift of quantum heterostructures 303D and 303E gradually decreasing as the distance between the base of the nanostructure and the quantum heterostructure increases. The combined effects of spectral blue-shift of quantum heterostructure 301A and the different extent of the spectral red-shift in quantum heterostructure 301B results in spectral broadening.

Figure 4:
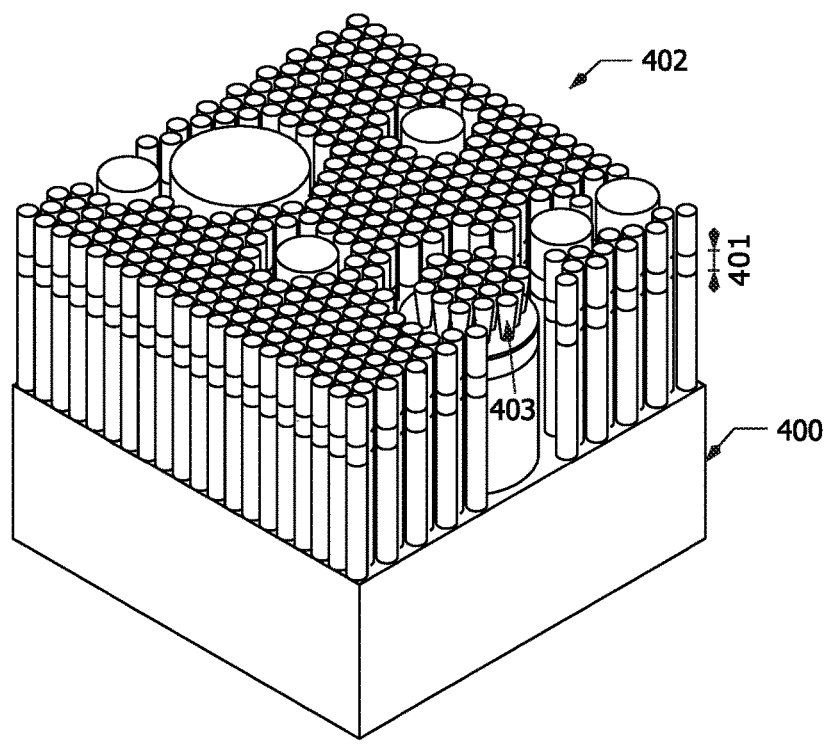
FIG. 4 illustrates a mixing of an ensemble of strain-relaxing nanostructures with different dimensions and another ensemble of strain-inducing nanostructures fabricated on a wafer comprising a light-emitting active region with long wavelength (green) light emission, wherein the strain-relaxing nanostructures would result in mixed green and blue light, and wherein the strain-inducing nanostructures would result in red light, thus the mixing of the strain-inducing and strain-relaxing nanostructures would result in mixed color emission, e.g., white.

FIG. 4 illustrates another embodiment of a nanostructure for spectral broadening. An ensemble of strain-relaxing nanostructures 402 is fabricated on a LED wafer with long wavelength (green) light emission. The nanostructures 402 are fabricated such that the active region 401 is completely contained within the nanostructure on a substrate 400, resulting in an emission of mixed green and blue light. An ensemble of strain-inducing nanostructures 403 is then fabricated on structures with larger dimensions or without strain-relaxing nanostructures, such that the strain-inducing region is overlapped with the active region. The active region is not completely contained within the nanostructures 403 for strain induction. The nanostructures 403 would result in red light emission, complementing the green and blue light emission from strain-relaxing nanostructures 402, achieving mixed color emission, e.g., white.

Figure 5A:
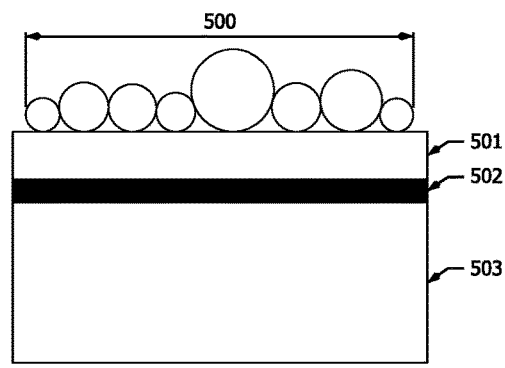
FIG. 5A illustrates a nanoscale hard lithographic mask formed by nanolithography.
Figure 5B:
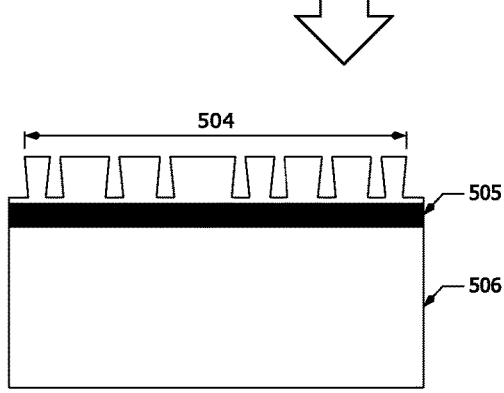
FIGS. 5B and 5C show the mask pattern transferred to the p-type semiconductor layer on the wafer by dry etching, forming a strain-inducing nanostructure.
Figure 5C:
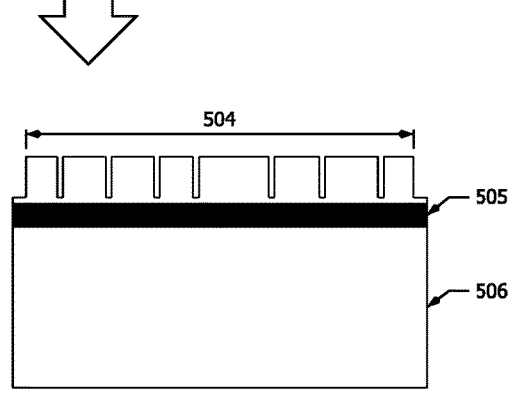

FIG. 5 shows transfer of a nanoscale pattern to a wafer comprising a light-emitting active region 502, an n-type semiconductor layer 503 and a p-type semiconductor contact layer 501. Referring to FIG. 5A, a nanoscale hard lithographic mask 500, is formed by nanolithography, including but not limited to nano-sphere lithography, e-beam lithography and nanoimprint lithography. FIG. 5B and FIG. 5C show the pattern having been transferred to the p-type semiconductor layer 501 on the wafer by dry etching, thus forming the strain-inducing nanostructure 504. The etch profile of the nanostructures can be changed by adjusting the etch recipe, forming reverse-tapered sidewall shown in FIG. 5B and straight sidewall shown in FIG. 5C. The former sidewall profile helps to reduce the base of the nanostructures, thereby increasing the effect of strain induction. The etch depth of nanostructure 504 should be chosen such that the etch depth terminates before reaching the active region 505, so that the active region is located around the base of the nanostructure 504. The n-type semiconductor layer 506 is un-affected by the process.

Transfer of the nanoscale pattern, as illustrated in FIG. 5, can be achieved by one of many ways of etching, including but not limited to plasma etching, ion etching, and laser etching.

With the nano-pillars formed on the LED wafers, interconnection of p-GaN layers of individual pillars is important so that electrical injection to all pillars can take place simultaneously. This may be achieved via one of several methods.

Figure 6A:
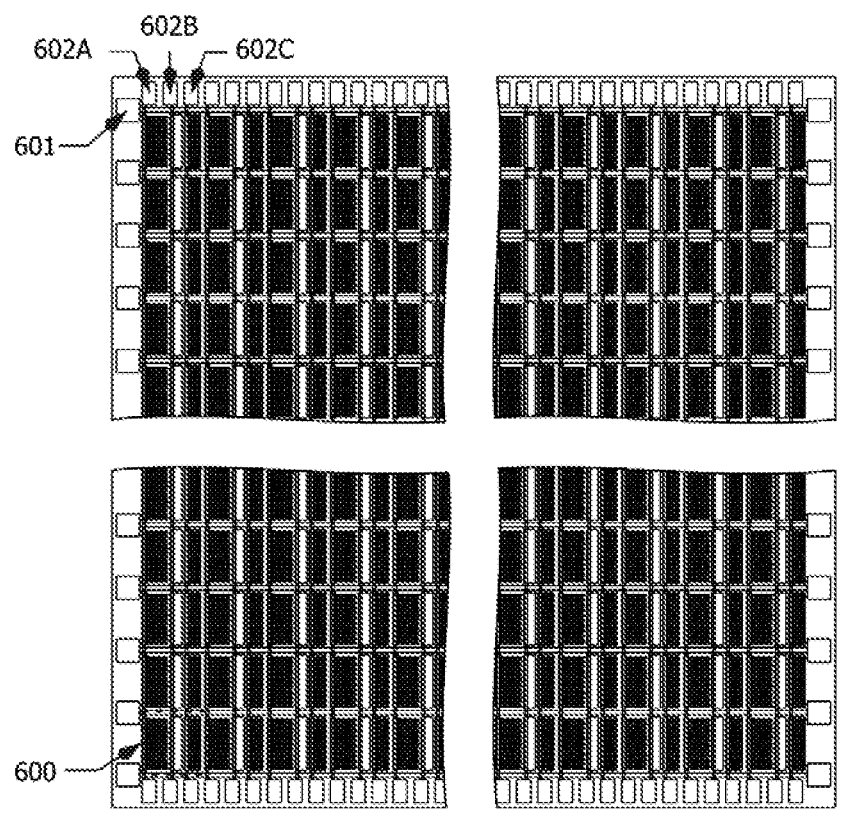
FIG. 6A illustrates a matrix addressable monolithic full color display, comprising a plurality of RGB pixels fabricated on a green light-emitting LED wafer based on III-V semiconductor materials.
Figure 6B:
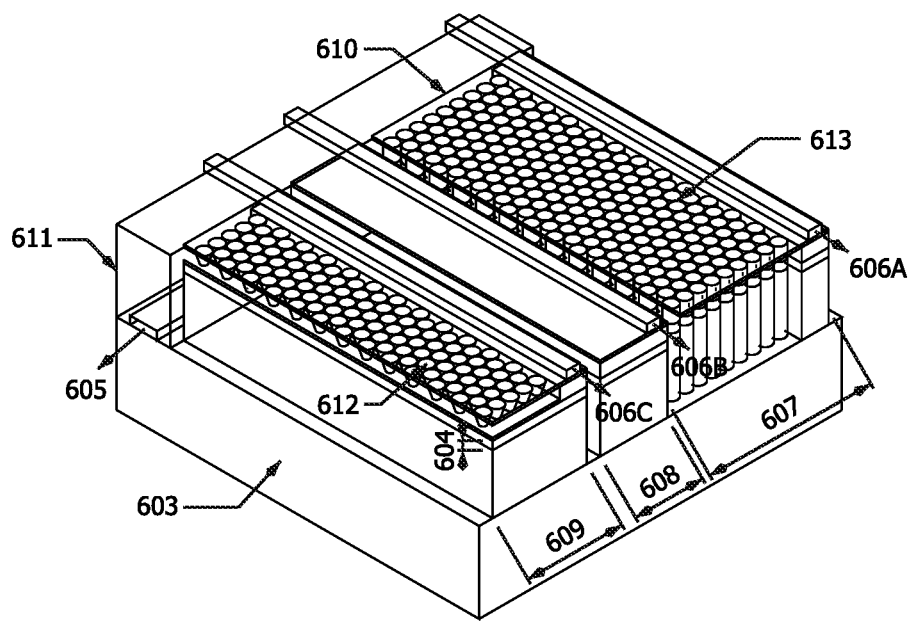
FIG. 6B illustrates a single RGB pixel, comprising 3 sub-pixels that emit red, green and blue light, wherein a plurality of strain-inducing nanostructures would result in red light to form the red sub-pixel, and wherein a plurality of strain-relaxing nanostructures would result in blue light to form the blue sub-pixel.

FIG. 6A illustrates an embodiment of a matrix addressable monolithic full color display implemented using the strain-inducing nanostructure and strain-relaxing nanostructure. The display comprises a plurality of RGB pixels 600 fabricated on a green light-emitting LED wafer based on III-V semiconductor materials. An external de-multiplexer/decoder is connected to the n-pads 601 and p-pads for red 602C, green 602B, and blue 602A sub-pixels to control the display. FIG. 6B illustrates a single RGB pixel, comprising three sub-pixels that emit red, green and blue light, wherein the red light-emitting sub-pixel 609 is formed by a plurality of strain inducing nanostructures 612 above the active region 604, and wherein the blue-emitting subpixel 607 is formed by strain-relaxing nanostructures 613 with the active region 604 being etched through. As the wafer 603 and an active region 604 that naturally emits green light, the green emitting sub-pixel 608 is un-modified. Each sub-pixel is topped with a current-spreading layer 610, and is electrically connected through an n-contact stripe 605 and p-contact stripes 606C, 606B and 606A for R, G and B sub-pixels, respectively. The n-contact stripe and p-contact stripe extend beyond the pixel to connect to the n-pad 601 and p-pads (602C, 602B, 602A) near the edge 611 of the display.

The current invention enables the following applications:
1. By spectral red-shifting, highly efficient green LEDs can be realized through spectral red-shifted blue LEDs which inherently have a high efficiency for solving the 'green gap' problem. At the same emission wavelength, red-shifting the LED can usually produce a more efficient LED because of its lower Indium content.
2. It can produce long wavelength LEDs, such a red LEDs, by spectral red-shifting of green LEDs.
3. It can create phosphor-free white-light LEDs by choosing an LED wafer with suitable peak emission wavelength (e.g., ~570-580 nm green LED) and by stretching the emission spectrum of that LEDs into the longer wavelength red region with relaxed and strain-induced nanostructures.

While the present invention has been particularly shown and described with reference to preferred embodiments thereof; it will be understood by those skilled in the art that various changes in form and details may be made therein without departing from the spirit and scope of the invention, and that the embodiments are merely illustrative of the invention, which is limited only by the appended claims.

What is claimed is:

1. A matrix addressable monolithic full color display, comprising RGB pixels fabricated on a green light-emitting LED wafer based on III-V semiconductor materials, wherein the red light-emitting pixels are formed by a plurality of strain-inducing nanostructures, and wherein the blue-emitting pixels are formed by a plurality of strain relaxing nano structures.

2. The matrix addressable monolithic full color display of claim 1 wherein each RGB pixel comprises:
   a green light-emitting LED wafer based on III-V semiconductor materials;
   a portion of the green LED wafer covered by a plurality of strain-inducing nanostructures fabricated using a top-down approach, said strain-inducing nanostructures having a base located at least close enough to an active region of the green light-emitting LED wafer that strain induction overlaps the active region so as to form a red sub-pixel with a red shift that emits red light; and
   another portion of the green light emitting LED wafer covered by a plurality of strain-relaxing nanostructures fabricated using a top-down approach so as to form a blue sub-pixel with a blue shift that emits blue light; and
   wherein a further portion of the green light emitting LED wafer is uncovered so as to form a green sub-pixel that emits green light.

3. The matrix addressable monolithic full color display of claim 1 wherein each RGB pixel has a column structure and further comprising:
   a current-spreading layer on top of each portion of the RGB pixel, and
   three p-contact stripes electrically connecting the spreading layers of each column of RGB pixels to three p-pads near the edge of the display, an n-contact stripe that connects an n-type semiconductor layer to an n-pad near the edge of the display for each row of RGB pixels.

4. The matrix addressable monolithic full color display of claim 3 wherein the RGB pixels are arranged in rows and columns in a frame and wherein the p-pads and n-pads are at the edge of the frame forming the display.

\* \* \* \* \*